United States Patent [19]

Sumi et al.

[11] 3,940,708

[45] Feb. 24, 1976

[54] GAIN CONTROL CIRCUIT

[75] Inventors: Takao Sumi, Tokyo; Masayuki Hongu, Komae, both of Japan

[73] Assignee: Sony Corporation, Tokyo, Japan

[22] Filed: Feb. 11, 1975

[21] Appl. No.: 549,080

[30] Foreign Application Priority Data

Feb. 14, 1974 Japan.............................. 49-18026

[52] U.S. Cl. .................. 330/29; 330/25; 330/30 D
[51] Int. Cl.$^2$ ......................................... H03G 3/30
[58] Field of Search ........ 330/29, 30 D, 69, 25, 145

[56] References Cited
UNITED STATES PATENTS 3,803,505  4/1974  Ishigaki et al........................ 330/29

Primary Examiner—James B. Mullins
Attorney, Agent, or Firm—Lewis H. Eslinger; Alvin Sinderbrand

[57] ABSTRACT

A gain control circuit of the balanced type whose gain is linearly controllable over a wide range and wherein the DC level at the circuit output is maintained at a constant value regardless of variations of the controlling current. The gain control circuit is comprised of a first differential amplifier which receives an input signal differentially applied thereto, and a second differential amplifier connected in series with the first differential amplifier. Unidirectional conductors are connected to the outputs of the first differential amplifier as a load impedance and variable currents are supplied to the first differential amplifier outputs to control the currents flowing in the unidirectional conductors and thereby vary the load impedances presented by the unidirectional conductors. The amplified output signal is derived from an output of the second differential amplifier.

11 Claims, 3 Drawing Figures

GAIN CONTROL CIRCUIT

BACKGROUND OF THE INVENTION

This invention relates to gain control circuits and, in particular, to an improved balanced-type gain control circuit which is linearly controllable over a wide range and in which the DC level at the circuit output is maintained at a substantially constant value regardless of variations of circuit control current.

Balanced-type of gain control circuits are known, and especially balanced-type AGC circuits. These conventional AGC circuits consist of a differential amplifier formed of differentially connected transistors having common-connected emitters which are driven by a first current source. Usually, the input signal which is to be amplified is applied through an emitter-follower input transistor to one of the inputs of the differentially connected transistors. In addition, a second current source is coupled to the respective bases of the differentially connected transistors by forward-biased diodes.

Although this balanced-type of gain control circuit has been used in the prior art, the operation thereof is accompanied by notable disadvantages. For example, if the output DC level is to be maintained constant, the first-mentioned current source connected to the common-connected emitters must be a constant current source. Accordingly, the second-named current source connected to the transistor base electrodes will be varied to thereby permit control of the amplifier gain. However, if, during a gain control operation, the current level of the second-mentioned current source is reduced to a small level so as to effect a large amplifier gain, the output impedance of the emitter-follower transistor increases. The ratio of the current produced by the second-mentioned current source to the control voltage which is applied thereto cannot be maintained constant at such low current levels and, as a result, the amplifier current gain cannot be linearly controlled over a satisfactorily wide range.

On the other hand, if the amplifier current gain is to be linearly controlled, the second-mentioned current source must be a constant current source. Hence, in that event, the current produced by the first-mentioned current source (coupled to the common-connected emitters) is varied to control the amplifier gain accordingly. However, now the DC level at the amplifier output also will vary in response to this variation of the first-mentioned current source.

OBJECTS OF THE INVENTION

Therefore, it is an object of the present invention to provide an improved gain control circuit which overcomes the disadvantages of the prior art.

Another object of this invention is to provide an improved balanced-type AGC circuit. A further object of the present invention is to provide an improved gain control circuit wherein the amplifier gain characteristics are linearly controlled over a wide range and the DC level at the amplifier output is kept constant regardless of variations of the gain controlling signal. Yet another object of this invention is to provide an improved AGC circuit including first and second differential amplifiers.

An additional object of this invention is to provide an improved AGC circuit wherein the gain of the differential amplifier included therein is linearly controlled by varying the effective load impedance of a diode connected in circuit.

It is another object of this invention to provide an improved AGC circuit including DC feedback circuitry to maintain a constant DC level output regardless of variations of temperature, supply voltage and element operating characteristics.

It is a further object of this invention to provide an improved AGC circuit that can be readily manufactured in the form of an integrated circuit.

Various other objects and advantages of the invention will become apparent from the forthcoming description and the novel features will be particularly pointed out in the appended claims.

SUMMARY OF THE INVENTION

In accordance with this invention, a gain control circuit is provided including a first differential amplifier coupled to a first constant current source and adapted to receive an input signal differentially applied thereto; a second differential amplifier connected in series with the first differential amplifier and coupled to a second constant current source, the second differential amplifier being adapted to produce an amplified output signal; unidirectional conductors connected to the first differential amplifier as load impedances therefor; and variable current sources coupled to the first differential amplifier to control the current flowing in the unidirectional conductors and thereby vary the load impedances presented by such unidirectional conductors.

BRIEF DESCRIPTION OF THE DRAWINGS

The following detailed description will best be understood in conjunction with the accompanying drawings in which.

DETAILED DESCRIPTION OF CERTAIN ONES OF THE PREFERRED EMBODIMENTS

Figure 1:
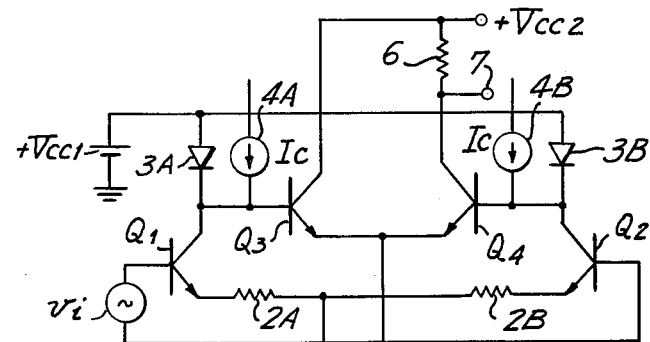
FIG. 1 is a schematic diagram of a basic gain control circuit in accordance with this invention.

Referring now to the drawings wherein like reference numerals are used throughout and, in particular, to FIG. 1, there is illustrated a schematic diagram of a gain control circuit which is linearly controlled over a wide range and wherein the DC level at the circuit output is kept constant regardless of variations of gain controlling currents. The gain control circuit is seen to be comprised of a first differential amplifier formed of differentially connected transistors $Q_1$ and $Q_2$ having respective emitters which are connected through emitter resistors 2A and 2B to a first constant current source 1. An input signal source represented as the source $v_i$ is differentially connected between the base electrodes of the transistors $Q_1$ and $Q_2$.

The gain control circuit additionally includes a second differential amplifier formed of differentially-connected transistors $Q_3$ and $Q_4$ having respective base electrodes connected to the collector electrodes of transistors $Q_1$ and $Q_2$, and having common-connected emitters which are connected to a second constant current source 5. The collectors of the first pair of differentially-connected transistors $Q_1$ and $Q_2$ are additionally connected through forward-biased unidirectional current conductors, such as diodes 3A and 3B, to a voltage supply source $V_{cc1}$. Also connected to the collectors of the transistors $Q_1$ and $Q_2$ (and thus the bases of transistors $Q_3$ and $Q_4$) are controllable current sources 4A and 4B, respectively. These controllable current sources are conventional and are adapted to produce output currents which are varied in response to a control signal, not shown. The currents $I_C$ produced by the controllable current sources 4A and 4B are equal and respond to a gain controlling signal so as to be varied by the same amount and in the same direction.

The collector of the transistor $Q_3$ included in the second differential amplifier is shown to be directly connected to a voltage supply source $V_{cc2}$, and the collector of the transistor $Q_4$ is connected to this voltage supply source through a load resistor 6. A circuit output terminal 7 is derived from the collector of the transistor $Q_4$.

In the illustrated circuit, if it is assumed that the constant current flowing through the first constant current source 1 is represented as $I_1$, then the current flowing through each of the transistors $Q_1$ and $Q_2$ is seen to be substantially equal to one-half of this constant current, i.e., $I_{1/2}$. This current flowing through each of the transistors $Q_1$ and $Q_2$ is recognized as being constant and is equal to the sum of the currents flowing to the collector electrode of the transistor. Stated otherwise, the current $I_{1/2}$ is equal to $I_C$ (the controllable current produced by the current source 4A or 4B) and the current $I_D$ (the current flowing through the diodes 3A or 3B). Now, if the gain controlling signal (not shown) is adjusted such that the control current $I_C$ is caused to decrease, the current $I_D$ flowing through the respective diodes must increase to maintain the constant current relationship. Thus, the effective impedances of the diodes 3A and 3B decrease to thereby decrease the load impedance of the first differential amplifier, resulting in a reduction in the gain of the illustrated circuit.

Conversely, if the control currents $I_C$ are caused to increase, the current $I_D$ flowing through the diode 3A and 3B must be reduced to thereby increase the effective diode impedances, thereby increasing the circuit gain.

Since the respective differentially-connected transistors are driven by the constant current sources 1 and 5, it is appreciated that the input impedances of the transistors $Q_1$ and $Q_2$ will be maintained constant so that the gain control characteristics of the illustrated circuit are linearly controllable by a gain controlling signal over a wide range. Also, the DC level at the output terminal 7 is kept constant so that the circuit exhibits a wide dynamic range.

Figure 2:
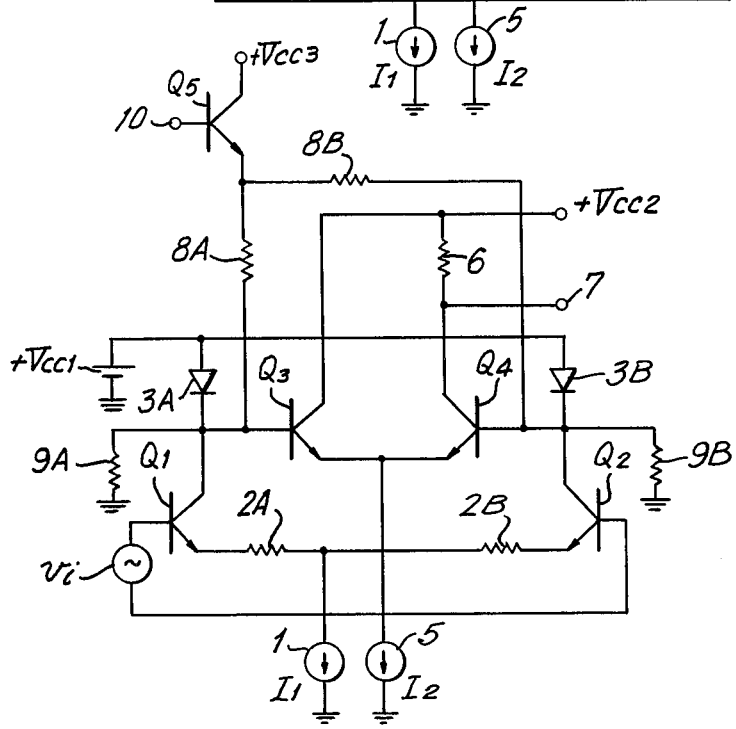
FIG. 2 is another embodiment of a gain control circuit of the present invention.

Referring now to FIG. 2, the same reference numerals are used to identify the same elements previously described with respect to FIG. 1. In the FIG. 2 embodiment, the controllable current sources 4A and 4B are depicted as a current generator including a transistor $Q_5$ having a base connected to a control voltage input terminal 10, a collector connected to a voltage supply source $V_{cc3}$ and an emitter connected through equal resistors 8A and 8B to the base electrodes of the differentially-connected transistors $Q_3$ and $Q_4$, respectively. It is appreciated that the current supplied through the resistors 8A and 8B is determined by the gain controlling voltage supplied to the transistors $Q_5$ at the input terminal 10. Resistors 9A and 9B are interconnected between the base electrodes of the transistors $Q_3$ and $Q_4$, respectively, and a source of reference potential, such as ground.

The gain control function attained by the FIG. 2 embodiment is substantially similar to the aforedescribed gain control circuit achieved by the circuit of FIG. 1. Thus, as the gain controlling voltage applied to the input terminal 10 varies, the currents flowing to the bases of the transistors $Q_3$ and $Q_4$ (and thus to the collectors of the transistors $Q_1$ and $Q_2$) cause the currents $I_D$ flowing through the diodes 3A and 3B to vary in the aforedescribed manner. Preferably, the resistors 9A and 9B have relatively small resistance values so as to compensate for fluctuations in the operating characteristics of these diodes. This compensation is especially effective for the case wherein the currents flowing through the diodes 3A and 3B are small. Accordingly, for the gain control function wherein the control currents flowing through the resistors 8A and 8B are increased to a high value to thereby increase the effective load impedance presented by the diodes 3A and 3B, substantially the same amount of current will still flow through the diodes because of the compensating resistors.

Figure 3:
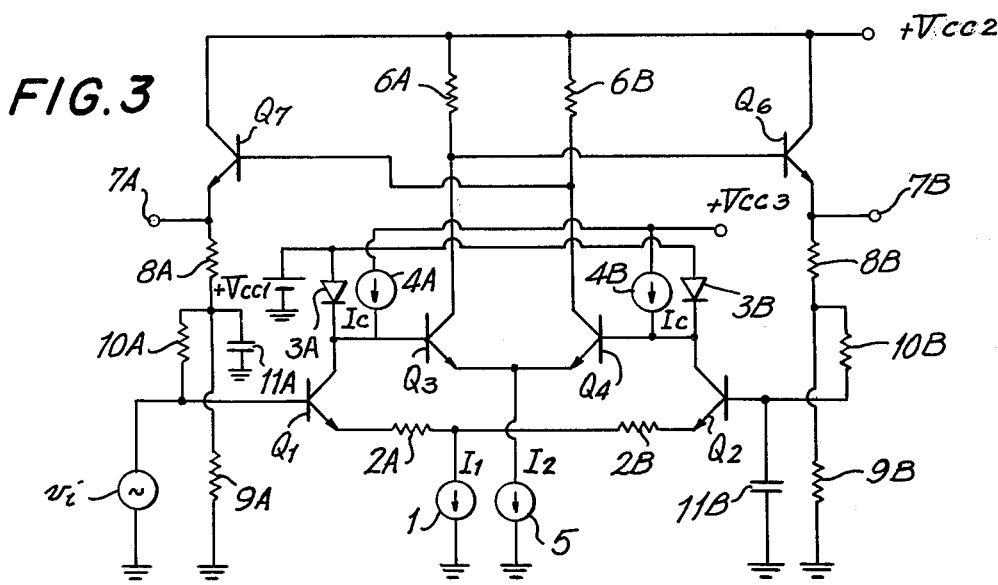
FIG. 3 is a schematic diagram of a further embodiment of the gain control circuit of this invention.

A still further embodiment of the present invention is schematically depicted in FIG. 3 wherein those elements which correspond to the previously described elements of FIG. 1 are identified by the same reference numerals. In FIG. 3, the DC level at the circuit output is maintained constant regardless of fluctuations of the operating characteristics of the diodes 3A and 3B, variation of ambient temperature and variation in supply voltage. This advantageous operation is attributed to a DC feedback loop between the second differential amplifier output and the first differential amplifier input. The respective collector electrodes of the transistors $Q_3$ and $Q_4$ correspond to the second differential amplifier output and, as shown, these collector electrodes are connected through the load resistors 6A and 6B, respectively, to the supply voltage source $V_{cc2}$. The collector electrode of the transistor $Q_3$ is coupled by a transistor $Q_6$ to the base input of the transistor $Q_2$. Similarly, the collector electrode of the transistor $Q_4$ is coupled by a transistor $Q_7$ to the base input of the transistor $Q_1$. The transistors $Q_6$ and $Q_7$ are disposed in emitter-follower configuration so that resistors 8A and 9A are connected in the emitter circuit of the transistor $Q_7$ to ground. Similarly, the resistors 8B and 9B are connected in the emitter circuit of the transistor $Q_6$ to ground. The respective emitters of the transistors $Q_7$ and $Q_6$ are connected to output terminals 7A and 7B, respectively.

As shown, the resistors 8A and 9A are connected in series, the junction defined thereby being connected to the base input of the transistor $Q_1$ through a resistor 10A. The junction defined by the resistors 8A, 9A and 10A is by-passed to ground by a capacitor 11A.

In a similar configuration, the resistors 8B and 9B are seen to be connected in series, and the junction defined thereby is connected to the base input of the transistor $Q_2$ through a resistor 10B. The base input of the transistor $Q_2$ is by-passed to ground by a capacitor 11B.

The operation of the circuit schematically depicted in FIG. 3 is substantially similar to the aforedescribed gain control circuit operation, but with this additional advantageous feature. Let it be assumed that the DC level provided at the base of the transistor $Q_3$ had somehow become higher than the DC level at the base of the transistor $Q_4$. Accordingly, and as is appreciated, the DC level provided at the base of the transistor $Q_7$ increases while the DC level at the base of the transistor $Q_6$ decreases, with the result that the DC level at the output 7A is increased and the DC level at the output 7B is decreased. Now, this increase in the DC level at the emitter of the transistor $Q_7$ is transmitted through the resistors 8A and 10A to the base of the transistor $Q_1$. With a consequential increase in the DC potential at the base electrode, the voltage at the collector of the transistor $Q_1$ is reduced. Thus, the DC level at the base of the transistor $Q_3$, which had been assumed to have increased, now is restored to its proper DC level. In an analogous manner, the reduction in the DC level at the output terminal 7B is transmitted through the resistors 8B and 10B to the base of the transistor $Q_2$ to thereby cause the DC potential at the collector of the transistor $Q_2$ (and thus at the base of the transistor $Q_4$) to increase. Thus, it is seen that the DC level at the base of the transistor $Q_4$, which had been assumed to have decreased, is restored to its proper value. Accordingly, the DC levels at the outputs 7A and 7B are maintained constant and at equal values in accordance with the embodiment depicted in FIG. 3.

While the present invention has been particularly shown and described with reference to certain preferred embodiments thereof, it will be obvious to those skilled in the art that various changes and modifications in form and details may be made without departing from the spirit and scope of the invention. For example, although the respective differential amplifiers are illustrated as being comprised of respective pairs of differentially-connected transistors, it is apparent that equivalent transistor devices, such as Darlington circuits, may be substituted for each transistor. Also, the illustrated diodes may be replaced by equivalent diode-connected transistors. Furthermore, although the illustrated reference potential has been described as being ground potential, it is apparent that any other reference potential may be selected, as desired. Therefore, it is intended that the appended claims be interpreted as including the foregoing as well as all other such changes and modifications.

What is claimed is:

1. A gain control circuit, comprising:
   first differential amplifier means coupled to a first constant current source, said first differential amplifier means having input means for receiving an input signal differentially applied thereto and output means;
   second differential amplifier means coupled to a second constant current source, said second differential amplifier means having input means connected to said first differential amplifier output means and output means for producing an amplified output signal;
   unidirectional conducting means connected to said first differential amplifier output means as load impedance therefor; and
   means for supplying a variable current to said first differential amplifier output means to control the current flowing in said unidirectional conducting means and thereby vary the load impedance presented by said unidirectional conducting means.

2. The gain control circuit in accordance with claim 1 wherein said means for supplying a variable current comprises current generating means responsive to a control signal applied thereto for generating a current having a magnitude determined by said control signal.

3. The gain control circuit in accordance with claim 2 and further comprising low impedance means connected to said first differential amplifier output means for compensating the fluctuations in the operating characteristics of said unidirectional conducting means.

4. The gain control circuit in accordance with claim 3 wherein said low impedance means comprises resistance means connected between said first differential amplifier output means and a source of reference potential.

5. The gain control circuit in accordance with claim 1 and further comprising feedback means between said second differential amplifier output means and said first differential amplifier input means.

6. The gain control circuit in accordance with claim 5 wherein said feedback means comprises emitter-follower means and wherein said amplified output signal is produced at an output of said emitter-follower means.

7. The gain control circuit in accordance with claim 6 wherein said emitter-follower means are interconnected so as to maintain a substantially constant DC output level of said gain control circuit regardless of DC level fluctuations at said respective first and second differential amplifier input means.

8. The gain control circuit in accordance with claim 7 wherein each of said first and second differential amplifier means comprises a pair of differentially connected transistors, and said emitter-follower means comprises a pair of emitter-follower transistors, the respective outputs of said emitter-follower transistors being connected to the respective base inputs of the first pair of differentially connected transistors.

9. The gain control circuit in accordance with claim 1 wherein said first and second differential amplifier means comprise first and second pairs of differential connected transistors, respectively, said first pair of transistors having common-connected emitter circuits coupled to said first constant current source; and said second pair of transistors having common-connected emitter circuits coupled to said second constant current source.

10. The gain control circuit in accordance with claim 9 wherein the respective collector electrodes of said first pair of transistors are connected to the respective base electrodes of said second pair of transistors; and wherein said unidirectional conducting means comprises first and second forward-biased diodes connected to the respective collector electrodes of said first pair of transistors.

11. The gain control circuit in accordance with claim 10 wherein said means for supplying a variable current comprises respective current sources for supplying respective controlled currents to said respective collector electrodes of said first pair of transistors, said respective controlled currents having the same magnitude and being controlled to vary by the same amount in the same direction.

* * * * *